US011210987B2

(12) United States Patent
Cheng et al.

(10) Patent No.: US 11,210,987 B2
(45) Date of Patent: Dec. 28, 2021

(54) SHIFT REGISTER CIRCUIT, METHOD OF DRIVING THE SAME, GATE DRIVING CIRCUIT AND DISPLAY PANEL

(71) Applicants: Beijing BOE Technology Development Co., Ltd., Beijing (CN); BOE TECHNOLOGY GROUP CO., LTD., Beijing (CN)

(72) Inventors: Hongfei Cheng, Beijing (CN); Xing Yao, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/985,925

(22) Filed: Aug. 5, 2020

(65) Prior Publication Data

US 2021/0193007 A1    Jun. 24, 2021

(30) Foreign Application Priority Data

Dec. 19, 2019    (CN) .......................... 201911317068.1

(51) Int. Cl.
*G09G 3/20*    (2006.01)
*G11C 19/28*    (2006.01)

(52) U.S. Cl.
CPC ............... *G09G 3/20* (2013.01); *G11C 19/28* (2013.01); *G09G 2300/0408* (2013.01); *G09G 2310/0267* (2013.01); *G09G 2310/0286* (2013.01); *G09G 2310/06* (2013.01)

(58) Field of Classification Search
CPC .... G11C 19/28–287; G11C 19/18–188; G09G 2310/0286; G09G 3/32–3291; G09G 3/20; G09G 3/3266; G09G 3/366; G09G 2300/0408; G09G 2310/0267; G09G 2310/06; G09G 2230/00
USPC .......................... 345/100, 76–83; 377/64–81
See application file for complete search history.

(56) References Cited

U.S. PATENT DOCUMENTS

| 2017/0140836 A1* | 5/2017 | Ma | ........................... G09G 3/20 |
| 2017/0330633 A1* | 11/2017 | Sun | ....................... G11C 19/186 |
| 2017/0365211 A1* | 12/2017 | Lee | ....................... G09G 3/3233 |

* cited by examiner

*Primary Examiner* — Amr A Awad
*Assistant Examiner* — Aaron Midkiff
(74) *Attorney, Agent, or Firm* — McCoy Russell LLP (57) ABSTRACT

A shift register circuit and a driving method thereof, a gate driving circuit and a display panel are provided. The shift register circuit includes: an input terminal; a first reference voltage terminal; a second reference voltage terminal; a first clock signal terminal; a second clock signal terminal; an output terminal; an input circuit, a first control circuit; a second control circuit; a third control circuit; a compensation circuit, a first node, a second node, a third node and an output circuit, the compensation circuit is configured to compensate a voltage of at least one of the first node, the second node, and the third node in response to the second clock signal.

14 Claims, 5 Drawing Sheets

SHIFT REGISTER CIRCUIT, METHOD OF DRIVING THE SAME, GATE DRIVING CIRCUIT AND DISPLAY PANEL

CROSS-REFERENCE TO RELATED APPLICATION

The present application claims priority to Chinese patent application No. 201911317068.1 filed on Dec. 19, 2019. The entire contents of the above-listed application is hereby incorporated by reference for all purposes

TECHNICAL FIELD

The present disclosure relates to the field of display technology, in particular to a shift register circuit, a method of driving the shift register circuit, a gate driving circuit, a display panel and a display device.

BACKGROUND

Gate Driver on Array (GOA) circuits or shift register circuits are widely used in display products. The GOA circuit is integrated on the array substrate and manufactured simultaneously with other display electrical components on the array substrate, which can reduce the cost of display products.

In the GOA circuit in the related art, in order to increase the driving capability or output capability of the transistor (taking a P-type transistor as an example) in the shift register and make it repeatedly turn on, it is usually necessary to pull down the voltage of the gate electrode of the transistor. At this time, due to the fluctuation of the potential of the adjacent electrical components, the voltage of the gate electrode of the transistor may be unstable, thereby affecting the stability of the driving waveform of the transistor, which may further affect the stability of the output waveform of the entire GOA circuit.

SUMMARY

In a first aspect, the present disclosure provides a shift register circuit, includes: an input terminal configured to receive an input signal; a first reference voltage terminal configured to be applied with a first reference voltage; a second reference voltage terminal configured to be applied with a second reference voltage; a first clock signal terminal configured to receive a first clock signal; a second clock signal terminal configured to receive a second clock signal; an output terminal configured to output an output signal; a input circuit, configured to control connection or disconnection between the input terminal and a first node, and connection or disconnection of the first reference voltage terminal and a second node in response to the first clock signal received at the first clock signal terminal; and control connection or disconnection of the first clock signal terminal and the second node in response to a potential of the first node; a first control circuit, configured to control connection or disconnection between the first node and a third node in response to the first reference voltage; a second control circuit, configured to control connection or disconnection between the second reference voltage terminal and the first node in response to the potential of the second node and the second clock signal; a third control circuit, configured to control connection or disconnection between the second reference voltage terminal and a fourth node in response to the potential of the first node, and control connection or disconnection between the second clock signal terminal and the fourth node in response to the potential of the second node and the second clock single; a compensation circuit, configured to compensate a voltage of at least one of the first node, the second node, and the third node in response to the second clock signal; and an output circuit, configured to control connection or disconnection of the first reference voltage terminal and the output terminal in response to the potential of the third node, and to control connection or disconnection between the second reference voltage terminal and the output terminal in response to the potential of the fourth node.

In some embodiment of the present disclosure, the compensation circuit is configured to simultaneously compensate voltages of the first node, the second node, and the third node in response to the second clock signal.

In some embodiment of the present disclosure, the compensation circuit includes: a first capacitor connected between the second clock signal terminal and the first node; a second capacitor connected between the second clock signal terminal and the second node; and a third capacitor connected between the second clock signal terminal and the third node.

In some embodiment of the present disclosure, the input circuit includes: a first transistor, having a gate electrode connected to the first clock signal terminal, a first electrode connected to the input terminal, and a second electrode connected to the first node; a second transistor having a gate electrode connected to the first node, a first electrode connected to the first clock signal terminal, and a second electrode connected to the second node; and a third transistor having a gate electrode connected to the first clock signal terminal, a first electrode connected to the first reference voltage terminal, and a second electrode connected to the second node.

In some embodiment of the present disclosure, the first control circuit includes: a fourth transistor having a gate electrode connected to the first reference voltage terminal, a first electrode connected to the first node, and a second electrode connected to the third node.

In some embodiment of the present disclosure, the second control circuit includes: a sixth transistor and a seventh transistor, wherein a gate electrode of the sixth transistor is connected to the second node, a first electrode of the sixth transistor is connected to the second reference voltage terminal, and a second electrode of the sixth transistor is connected to a first electrode of the seventh transistor, a gate electrode of the seventh transistor is connected to the second clock signal terminal, the first electrode of the seventh transistor is connected to the second electrode of the sixth transistor, and a second electrode of the seventh transistor is connected to the first node.

In some embodiment of the present disclosure, the third control circuit includes: an eighth transistor having a gate electrode connected to the second node, a first electrode connected to the second clock signal terminal, and a second electrode connected to a sixth node; a ninth transistor having a gate electrode connected to the second clock signal terminal, a first electrode connected to the sixth node, and a second electrode connected to the fourth node; a tenth transistor having a gate electrode connected to the first node, a first electrode connected to the second reference voltage terminal, and a second electrode connected to the fourth node.

In some embodiment of the present disclosure, the third control circuit further includes: a thirteenth transistor having a gate electrode connected to the first reference voltage terminal, a first electrode connected to the second node, and a second electrode connected to a seventh node; a fourth capacitor connected between the sixth node and the seventh node.

In some embodiment of the present disclosure, the output circuit includes: an eleventh transistor having a gate electrode connected to the fourth node, a first electrode connected to the second reference voltage terminal, and a second electrode connected to the output terminal; and a twelfth transistor having a gate electrode connected to the third node, a first electrode connected to the first reference voltage terminal, and a second electrode connected to the output terminal.

In some embodiment of the present disclosure, the output circuit further comprises a fifth capacitor connected between the fourth node and the second reference voltage terminal.

In a second aspect, a gate driving circuit includes N stages of shift register circuits according to claim 1 connected in series, wherein N is an integer greater than or equal to 2, in the N stages of shift register circuits, an output terminal of an mth stage of shift register circuit is connected to an input terminal of an (m+1)th stage of shift register circuit, wherein m is an integer and 1≤m<N.

In a third aspect, a display panel includes: a first reference voltage line configured to transmit a first reference voltage; a second reference voltage line configured to transmit a second reference voltage; a first clock line and a second clock line, configured to transmit a first clock signal and a second clock signal, wherein the first clock signal and the second clock signal are opposite in phase; and the gate driving circuit, wherein each first reference voltage terminal of each of the N stages of shift register circuits is connected to the first reference voltage line, each second reference voltage terminal of each of the N stages shift register circuits is connected to the second reference voltage line, a first clock signal end of the (2k−1)th stage of shift register circuit and a second clock signal end of the 2kth stage of shift register circuit in the N stages of shift register circuits are connected to the first clock line, and a second clock signal end of the (2k−1)th stage of shift register circuit and a first clock signal end of the 2kth stage of shift register circuit in the N stages of shift register circuits are connected to the second clock line, k is a positive integer and 2k≤N.

In a fourth aspect, a display device includes: the display panel; a timing controller configured to control the operation of the display panel, wherein the timing controller is configured to supply a first clock signal and a second clock signal to a first clock line and a second clock line, respectively, the first clock signal and the second clock signal are opposite in phase; and a voltage generator configured to supply a first reference voltage and a second reference voltage to a first reference voltage line and a second reference voltage line, respectively, under the control of the timing controller.

In a fifth aspect, a method of driving the shift register circuit includes: providing an input signal to an input terminal; providing a first clock signal and a second clock signal to a first clock signal terminal and a second clock signal terminal respectively; providing a first reference voltage to a first reference voltage terminal and providing a second reference voltage to the second reference voltage terminal, wherein the first reference voltage and the second reference voltage are at different potentials; and in response to the input signal, the first clock signal, the second clock signal, the first reference voltage, and the second reference voltage, the shift register circuit performing the following operations: outputting an output signal from an output terminal.

In some embodiment of the present disclosure, in response to a voltage change of the second clock signal, the voltage of at least one of the first node, the second node, and the third node is compensated.

BRIEF DESCRIPTION OF THE DRAWINGS

According to the following detailed description and the accompanying drawings, it will be easy to understand the various aspects, features and advantages of the present disclosure.

It should be noted that the above-mentioned drawings are only for illustration, and are not necessarily drawn in scale.

DETAILED DESCRIPTION

Hereinafter, several embodiments disclosed in the present disclosure will be described in more detail with reference to the accompanying drawings so as to enable those skilled in the art to realize the present disclosure. However, the present disclosure can be embodied in many different forms and should not be construed as being limited to the embodiments set forth herein. On the contrary, these embodiments are provided so that the present disclosure is comprehensive and complete, and will fully convey the scope of the present disclosure to those skilled in the art. The embodiments do not limit the present disclosure.

It will be understood that, although the terms first, second, third, and so on may be used herein to describe various elements, components and/or parts, these elements, components and/or parts should not be limited by these terms. These terms are only used to distinguish one element, component or part from another element, component or part. Therefore, the first element, component or part discussed below may be referred to as the second element, component or part without departing from the teachings disclosed in the present disclosure.

The terms used herein are only for the purpose of describing specific embodiments and are not intended to limit the present disclosure. As used herein, the singular forms "a," "an," and "the" are intended to also include the plural forms, unless the context clearly indicate otherwise. It will be further understood that the terms "including" and/or "comprising" when used in this specification designate the existence of the described features, wholes, steps, operations, elements and/or components, but do not exclude the existence of one or more other features, wholes, steps, operations, elements, components, and/or groups thereof or the addition of one or more other features, wholes, steps, operations, elements, components, and/or groups thereof. As used herein, the term "and/or" includes any and all combinations of one or more of the associated listed items.

It will be understood that when an element is referred to as being "connected to another element" or "coupled to another element," it can be directly connected to the other element or directly coupled to the other element, or intervening elements may be present. In contrast, when an element is referred to as being "directly connected to another element" or "directly coupled to another element," no intervening elements are present.

Unless otherwise defined, all terms (including technical and scientific terms) used herein have the same meanings as commonly understood by those of ordinary skill in the art to which the present disclosure belongs. It will be further understood that terms such as those defined in commonly used dictionaries should be interpreted as having meanings consistent with their meanings in the relevant field and/or the context of this specification, and will not be interpreted by an over idealized manner or in an over formal sense, unless explicitly defined as such in this disclosure.

Figure 1:
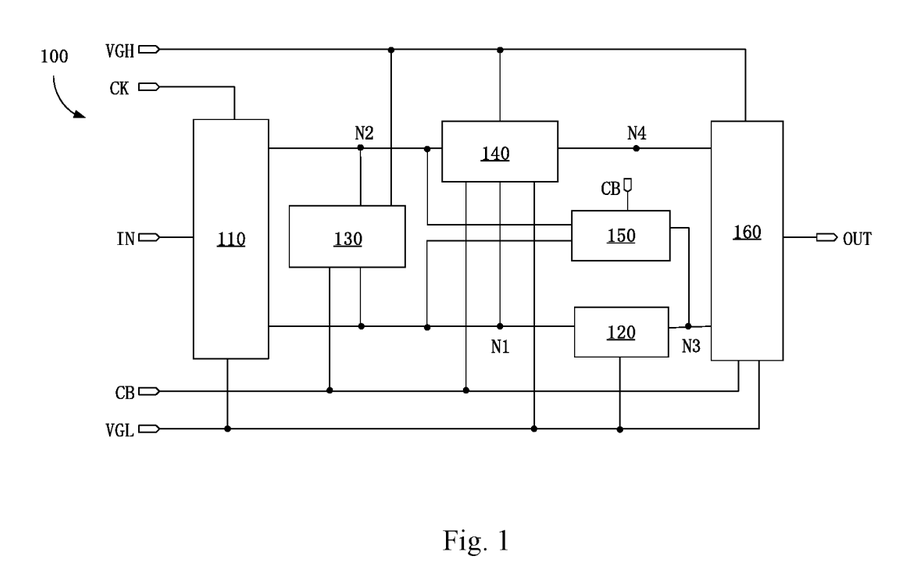
FIG. 1 shows a schematic structural block diagram of a shift register circuit according to some embodiments of the present disclosure.

FIG. 1 schematically shows a block diagram of a shift register circuit 100 according to some embodiments of the present disclosure. Referring to FIG. 1, the shift register circuit 100 includes an input terminal IN configured to receive an input signal, a first reference voltage terminal VGL configured to be applied with a first reference voltage, and a second reference voltage terminal VGH configured to be applied with a second reference voltage, a first clock signal terminal CK configured to receive a first clock signal, a second clock signal terminal CB configured to receive a second clock signal, and an output terminal OUT configured to output an output signal. As shown in FIG. 1, the shift register circuit 100 further includes an input circuit 110, a first control circuit 120, a second control circuit 130, a third control circuit 140, a compensation circuit 150 and an output circuit 160 which are illustrated as blocks.

The input circuit 110 may be configured to control the connection or disconnection between the input terminal IN and the first node N1, and the connection or disconnection of the first reference voltage terminal VGL and the second node N2 in response to the first clock signal received at the first clock signal terminal CK; and control the connection or disconnection of the first clock signal terminal CK and the second node N2 in response to the potential of the first node N1. Specifically, for example, the input circuit 110 may be configured to input the input signal to the first node N1 and the first reference voltage to the second node N2 in response to the first clock signal received at the first clock signal terminal CK being valid; and input the first clock signal to the second node N2 in response to the first node N1 being at a valid potential.

The first control circuit 120 may be configured to control the connection or disconnection between the first node N1 and the third node N3 based on the potentials of the first node N1 and the third node N3 in respond to the first reference voltage signal VGL received at the first reference voltage terminal. Specifically, for example, the first control circuit 120 may be configured to connect the first node N1 and the third node N3 when the first reference voltage signal VGL is at a low level 0 and the first node N1 is at a first potential V1 greater than the low level 0; or, the first control circuit 120 may be configured to connect the first node N1 and the third node N3 when the first reference voltage signal VGL is at the low level 0 and the third node N3 is at the first potential V1 greater than the low level 0; or the first control circuit 120 can be configured to disconnect the first node N1 from the third node N3 when the first reference voltage signal VGL is at a low level 0, and the first node N1 and a third node N3 are at a second potential V2 lower than the low level 0.

The second control circuit 130 may be configured to control the connection or disconnection between the second reference voltage terminal VGH and the first node N1 in response to the potential of the second node N2 and the second clock signal received at the second clock signal terminal CB. Specifically, for example, the second control circuit 130 may be configured to connect the second reference voltage terminal VGH to the first node N1 in response to the second node N2 being at a valid potential and the second clock signal received at the second clock signal terminal CB being valid.

The third control circuit 140 may be configured to control the connection or disconnection between the second reference voltage terminal VGH and the fourth node N4 in response to the potential of the first node N1, and control the connection or disconnection between the second clock signal terminal CB and the fourth node N4 in response to the potential of the second node N2 and the second clock single received at the second clock signal terminal CB. Specifically, for example, the third control circuit 140 may be configured to connect the second clock signal terminal CB to the fourth node N4 in response to the second node N2 being at a valid potential and the second clock signal received at the second clock signal terminal CB being valid; and connect the second reference voltage terminal VGH to the fourth node N4 in response to the first node N1 being at a valid potential.

The compensation circuit 150 may be configured to compensate the voltage of at least one of the first node N1, the second node N2, and the third node N3 in response to the second clock signal received at the second clock signal terminal CB. Specifically, for example, the compensation circuit 150 may be configured to compensate the voltage of at least one of the first node N1, the second node N2, and the third node N3 to be a larger or smaller voltage in response to the second clock signal received at the second clock signal terminal CB becoming higher or lower.

The output circuit 160 may be configured to control the connection or disconnection of the first reference voltage terminal VGL and the output terminal OUT in response to the potential of the third node N3, and to control the connection or disconnection between the second reference voltage terminal VGH and the output terminal in response to the potential of the fourth node N4. Specifically, for example, the output circuit 160 may be configured to connect the first reference voltage terminal VGL to the output terminal OUT in response to the third node N3 being at a valid potential, and connect the second reference voltage terminal VGL to the output terminal OUT in response to the fourth node N4 being at a valid potential.

The term "valid potential" as used herein refers to the potential at which a circuit element (for example, a transistor) is activated, such as a voltage applied to the gate electrode of a transistor so that the transistor is turned on, that is the source electrode and drain electrode are connected. The term "invalid potential" as used herein refers to the potential at which the circuit element is turned off, such as a potential applied to the gate electrode of a transistor so that the transistor is turned off, that is the source electrode and drain electrode are disconnected. For an n-type transistor, the valid potential is a high potential, which can also be represented as 1, and the invalid potential is a low potential, which can also be represented as 0. For a p-type transistor, the valid potential is a low potential, which can also be represented as 0, and the invalid potential is a high potential, which can also be represented as 1. It will be understood that the valid potential or the invalid potential is not intended to refer to a specific potential, but may include a range of potentials. In addition, the terms "level voltage", "voltage level" and the like are intended to be used interchangeably with "potential".

In this disclosure, clock signal being valid means that the corresponding clock signal terminal is at "a valid potential", that is, the potential at which the circuit element (for example, transistor) is turned on, and the clock signal being invalid means that the corresponding clock signal terminal is at "an invalid potential", that is, the potential at which the circuit element is turned off. For some embodiments disclosed in the present disclosure, the clock signal being valid means that the corresponding clock signal terminal is at a low potential, and the clock signal being invalid means that the corresponding clock signal terminal is at a high potential.

It is easy to understand that in the shift register circuit 100 shown in FIG. 1 according to some embodiments of the present disclosure, in the compensation circuit 150, when the second clock signal received at the second clock signal terminal CB changes from a high level to a low level and the first node N1 and the third node N3 are in a floating state at the same time, the potentials of the first node N1 and the third node N3 are also pulled down, which can disconnect the first node N1 from the third node N3 completely, and at other times, the first node N1 and the third node N3 are connected. In this way, while ensuring the normal operation of the entire shift register circuit 100, the third node N3 needs to be stably maintained at a valid potential, the first node N1 and the third node N3 can be completely disconnected, so that the potentials thereof are completely independent, and do not affect each other, thereby preventing the potential fluctuation of the electrical components adjacent to the first node N1 from damaging the stability of the potential of the third node N3. In addition, since the third node N3 is connected to the output circuit 160, the potential of the third node N3 is kept stable, thereby ensuring the stable operation of the transistors related to the third node in the output circuit 160, improving the stability of the output waveform of the entire shift register circuit 100, and ensuring the quality of the output pulse at the output terminal OUT. In the shift register circuit 100 according to other embodiments of the present disclosure shown in FIG. 1, in the compensation circuit 150, when the second clock signal received at the second clock signal terminal CB changes from a high level to a low level, and the second node N2 is in the floating state at the same time, the potential of the second node N2 is also pulled down, so that the second reference voltage terminal VGH and the first node N1 can be completely connected, thereby improving the stability of the output waveform of the entire shift register circuit 100, and ensuring the quality of the output pulse at the output terminal OUT.

Figure 2:
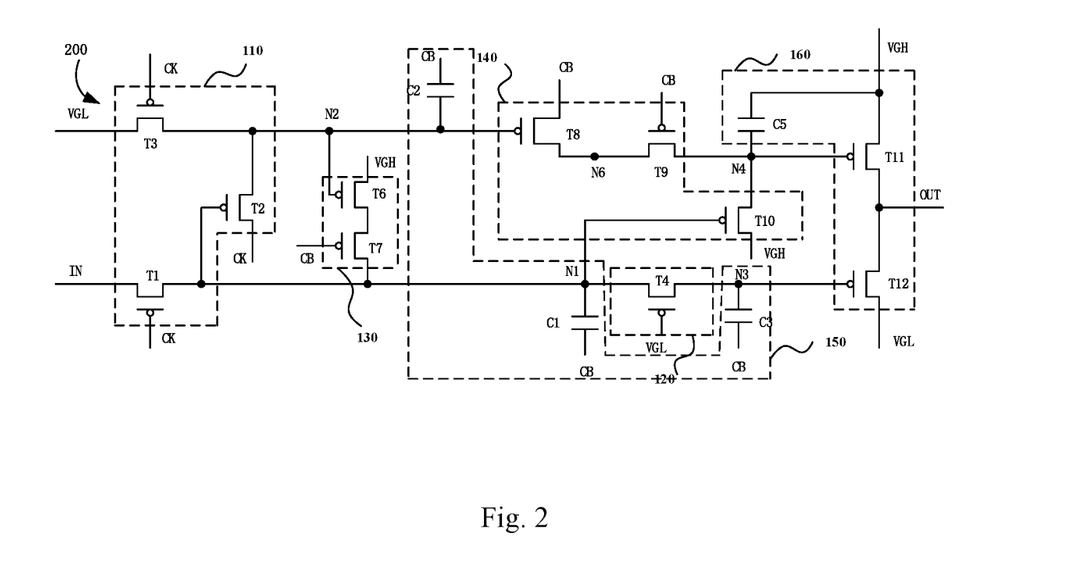
FIG. 2 shows a circuit diagram of a shift register circuit shown in FIG. 1 according to some embodiments of the present disclosure.

FIG. 2 schematically shows the circuit structure of the first example circuit 200 of the shift register circuit 100 shown in FIG. 1. The first example configuration of the shift register circuit 200 is described below with reference to FIG. 2.

The input circuit 110 includes a first transistor T1, a second transistor T2, and a third transistor T3. The first transistor T1 has a gate electrode connected to the first clock signal terminal CK, a first electrode connected to the input terminal IN, and a second electrode connected to the first node N1. The second transistor T2 has a gate electrode connected to the first node N1, a first electrode connected to the first clock signal terminal CK, and a second electrode connected to the second node N2. The third transistor T3 has a gate electrode connected to the first clock signal terminal CK, a first electrode connected to the first reference voltage terminal VGL, and a second electrode connected to the second node N2.

The first control circuit 120 includes a fourth transistor T4. The fourth transistor T4 has a gate electrode connected to the first reference voltage terminal VGL, a first electrode connected to the first node N1, and a second electrode connected to the third node N3.

The second control circuit 130 includes a sixth transistor T6 and a seventh transistor T7. The sixth transistor T6 has a gate electrode connected to the second node N2 and a first electrode connected to the second reference voltage terminal VGH, and the seventh transistor T7 has a gate electrode connected to the second clock signal terminal CB, a second electrode connected to the first node N1, and the second electrode of the sixth transistor T6 is connected to the first electrode of the seventh transistor T7.

The third control circuit 140 includes an eighth transistor T8, a ninth transistor T9, and a tenth transistor T10. The eighth transistor T8 has a gate electrode connected to the second node N2, a first electrode connected to the second clock signal terminal CB, and a second electrode connected to the sixth node N6. The ninth transistor T9 has a gate electrode connected to the second clock signal terminal CB, a first electrode connected to the sixth node N6, and a second electrode connected to the fourth node N4. The tenth transistor T10 has a gate electrode connected to the first node N1, a first electrode connected to the second reference voltage terminal VGH, and a second electrode connected to the fourth node N4.

The compensation circuit 150 includes a first capacitor C1, which is connected between the second clock signal terminal CB and the first node N1.

Optionally, the compensation circuit 150 includes a second capacitor C2, which is connected between the second clock signal terminal CB and the second node N2.

Optionally, the compensation circuit 150 includes a third capacitor C3, which is connected between the second clock signal terminal CB and the third node N3.

Optionally, the compensation circuit 150 includes a first capacitor C1, which is connected between the second clock signal terminal CB and the first node N1; a second capacitor C2, which is connected between the second clock signal terminal CB and the second node N2, and a third capacitor C3, which is connected between the second clock signal terminal CB and the third node N3.

The output circuit 160 includes an eleventh transistor T11 and a twelfth transistor T12. The eleventh transistor T11 has a gate electrode connected to the fourth node N4, a first electrode connected to the second reference voltage terminal VGH, and a second electrode connected to the output terminal OUT. The twelfth transistor T12 has a gate electrode connected to the third node N3, a first electrode connected to the first reference voltage terminal VGL, and a second electrode connected to the output terminal OUT.

Optionally, as shown in FIG. 2, the output circuit 160 may further include a fifth capacitor C5, which is connected between the second reference voltage terminal VGH and the fourth node N4. The existence of the fifth capacitor C5 is advantageous because the potential at the fourth node N4 can be maintained stable by the energy storage effect of the capacitor C3, so as to stabilize the state of the eleventh transistor T11, thereby ensuring the stability of the output waveform.

It should be noted that the transistor mentioned in the present disclosure is not limited to a single transistor, and may be a plurality of transistors connected in series. In the disclosed embodiments of the present disclosure, the term "nth transistor" includes one transistor as an example, and the above-mentioned transistor may be a P-type transistor or a N-type transistor. In some embodiments of the present disclosure, when the above-mentioned transistor is a P-type transistor, the term "first electrode of the transistor" specifically refers to the source electrode, and "second electrode of the transistor" specifically refers to the drain electrode. When the above-mentioned transistor is an N-type transistor, the term "first electrode" is the drain electrode, and the term "second electrode" is the source electrode. The disclosed embodiments of the present disclosure are described by taking each transistor as a P-type transistor as an example. The turn-on voltage of the gate electrode is a low level voltage, and the turn-off voltage is a high level voltage. Although the transistors are illustrated and described as P-type transistors, N-type transistors are also possible. In the case of an N-type transistor, the turn-on voltage of the gate electrode is a high level voltage, and the turn-off voltage is a low level voltage. In various embodiments, the transistors maybe thin film transistors, which are typically fabricated such that the first and second electrodes can be used interchangeably.

Figure 3:
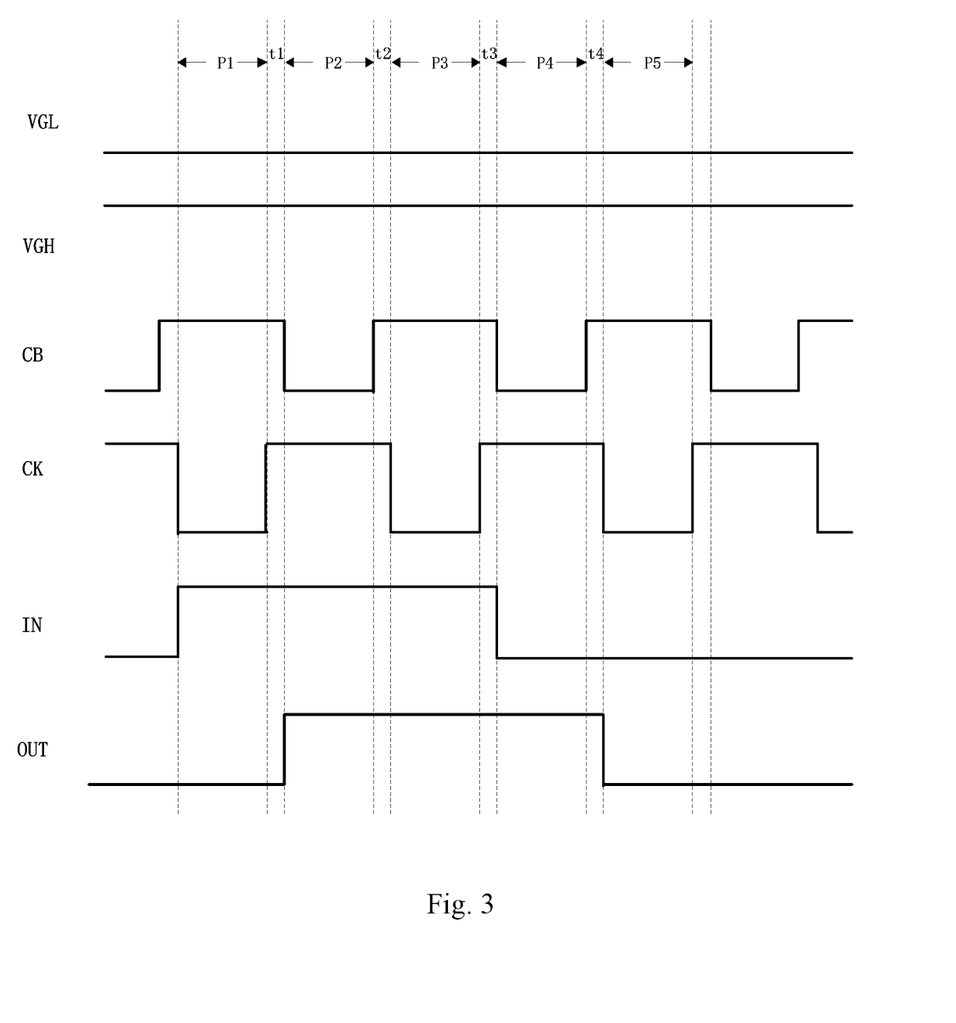
FIG. 3 shows a timing diagram of a shift register circuit shown in FIG. 2.

FIG. 3 schematically shows a timing diagram for the shift register circuit 200 shown in FIG. 2. In this example, it can be assumed that the first reference voltage terminal VGL and the second reference voltage terminal VGH are respectively applied with a low level voltage and a high level voltage.

The operation process of the example circuit 200 shown in FIG. 2 is described below with reference to FIG. 3. In the following, 1 represents a high level, and 0 represents a low level. As shown in FIG. 3, the operation process of the circuit 200 includes five phases P1-P5, but since the clock signal of the first clock signal terminal CK and the clock signal of the second clock signal terminal CB are not completely synchronized, four small time intervals t1-t4 are arranged between the five phases P1-P5. As shown in the figure, in the waveforms of the first clock signal and the second clock signal outputted by the first clock signal terminal CK and the second clock signal terminal CB, the duration of the high level is slightly longer than the duration of the low level.

First, the working state of the circuit 200 before P1 (before the arrival of the input pulse) is analyzed in conjunction with FIG. 3. As shown in FIG., at various time points before P1, IN always remains at 0. When CK=0 and CB=1, the first transistor T1 is turned on and transmits the low voltage of the input terminal IN to the first node N1, and therefore, N1 is at a low potential. In response to N1 being at the low potential, the second transistor T2 and the tenth transistor T10 are turned on, and transmit the low voltage of the first clock signal terminal CK and the high voltage of the second reference voltage terminal VGH to the second node N2 and the fourth node N4 respectively, thus the second node N2 is at a low potential and the fourth node N4 is at a high potential. When CK changes from 0 to 1, and CB maintains at 1, the first node N1 maintains at a low potential, the tenth transistor T10 is kept off, and the fourth node N4 maintains at a high potential. Therefore, at various time points before P1, the fourth node N4 always maintains at a high potential, and the first node N1 and the third node N3 (because the first reference voltage terminal VGL is applied with a low level voltage, the fourth transistor T4 is turned on) always maintain at a low potential, so that the eleventh transistor T11 is kept off and the twelfth transistor T12 is kept on, thereby ensuring that the output terminal OUT outputting a low voltage.

As shown in FIG. 3, in the phase P1, IN=1, CK=0, and CB=1. Since CK=0 and IN=1, the first transistor T1 is turned on and transmits the high level voltage from the input terminal IN to the first node N1, so that the first node N1 is set at an invalid potential (high potential); the third transistor is turned on and transmits the low level of the first reference voltage terminal VGL to the second node N2, so that the second node N2 is set at a valid potential. Since CB=1, the seventh transistor T7 and the ninth transistor T9 are turned off. Accordingly, since N1 is at an invalid potential, the second transistor T2 and the tenth transistor T10 are turned off. Since N2 is at the valid potential, the sixth transistor T6 and the eighth transistor T8 are turned on.

Furthermore, since the first reference voltage terminal VGL is applied with a low level voltage, the fourth transistor T4 is turned on, so that the high level voltage at point N1 is transmitted to the third node N3. In this way, the third node N3 has the same potential as the first node N1 and is at an invalid potential (high potential), so that the twelfth transistor T12 is turned off. Since the ninth transistor T9 and the tenth transistor T10 are turned off, the fourth node N4 is floating and maintains at the potential in the previous time point, that is, the high potential (based on the above analysis, the fourth node N4 maintains at the high potential before the phase P1), thus the eleventh transistor T11 is turned off Therefore, since both T11 and T12 are turned off, the output voltage of the output terminal OUT should be the output voltage at the previous time point (the time point before P1), that is, the low level voltage.

During the time interval t1, IN=1, CK changes from 0 to 1, and CB=1. At this time, in response to CK=1, the first clock signal is invalid, and the first transistor T1 and the third transistor T3 are turned off; in response to CB=1, the second clock signal remains invalid, and the seventh transistor T7 and the ninth transistor T9 are kept off. Correspondingly, the first node N1 maintains at the high potential (invalid potential) of the previous phase (P1), so that the second transistor T2 and the tenth transistor T10 are kept off; thus, the second node N2 maintains at the valid potential (low potential), and the fourth node N4 is still in the floating state, maintaining the high potential of the previous phase (P1), so that the eleventh transistor T11 is still kept off. Since the second clock signal terminal CB maintains at a high level, the third node N3 also maintains at a high level, so the twelfth transistor T12 is still kept off. Therefore, the output terminal OUT still outputs the low level voltage of the previous phase.

In the phase P2, IN=1, CK=1, and CB changes from 1 to 0. In response to CK=1, the first clock signal is invalid, and the first transistor T1 and the third transistor T3 are kept off; in response to CB=0, the second clock signal is valid (at low level), and the seventh transistor T7 and the ninth transistor T9 are turned on. Due to the coupling effect of the capacitor C2 connected between the second clock signal terminal CB and the second node N2, the voltage of the second node N2 is pulled down to the second potential V2 lower than the low voltage 0, and the sixth transistor T6 is turned on. In response to the sixth transistor T6 and the seventh transistor T7 being turned on at the same time, the second reference voltage terminal VGH is connected to N1, and the first node N1 is applied with a high level voltage in response to the second reference voltage terminal VGH. In addition, the first node N1 is connected to the third node N3 through the fourth transistor T4, so the second reference voltage terminal VGH will charge the first node N1 and the third node N3, so that these two nodes are always at a high potential (because the second reference voltage terminal VGH is applied with a high level voltage).

It is easy to understand that the function of the sixth transistor T6 and the seventh transistor T7 is that, when the N1 and N3 points are at an invalid potential (ie, a high potential), since the voltage of the second clock signal terminal CB becomes a low level, the potential of N1 and the potential of N3 may be pulled down by the first capacitor C1 and the third capacitor C3, the high voltage of the second reference voltage terminal VGH is used to charge N1 and N3 to keep the potentials thereof stable, that is, at a high potential, so as not to affect the normal output of the output terminal OUT.

In response to the third node N3 being at an invalid potential, that is, a high potential, the twelfth transistor T12 is kept off. At the same time, in response to the eighth transistor T8 and the ninth transistor T9 being turned on at the same time, the low level voltage of the second clock signal terminal CB is transmitted to the fourth node N4, and the fourth node N4 is set at the valid potential (a low potential), so that the eleventh transistor T11 is turned on and transmits the high voltage of the second reference voltage terminal VGH to the output terminal OUT. Therefore, in response to the twelfth transistor T12 being turned off and the eleventh transistor T11 being turned on, the output terminal OUT outputs a high level voltage.

At time interval t2, IN=1, CK=1, and CB changes from 0 to 1. At this time, in response to CK=1, that is, the first clock signal is invalid, the first transistor T1 and the third transistor T3 are still kept off. In response to CB=1, the second clock signal becomes invalid (a high level), and the seventh transistor T7 and the ninth transistor T9 are turned off. Since CB changes from 0 to 1, that is, the second clock signal terminal CB changes from a low level state to a high level state, due to the coupling effect of the capacitor C1 connected between the second clock signal terminal CB and the first node N1, the voltage of the first node N1 is pulled up to the third potential V3 higher than the high voltage 1. Due to the coupling effect of the capacitor C3 connected between the second clock signal terminal CB and the third node N3, the voltage of the third node N3 is pulled up to the third potential V3 higher than the high voltage 1. At the same time, since the fourth transistor T4 is turned on, the potentials of the first node N1 and the third node N3 are the same, and both are at an invalid potential (high potential). Therefore, the second transistor T2, the tenth transistor T10, and the twelfth transistor are still kept off.

Due to the coupling effect of the capacitor C2 connected between the second clock signal terminal CB and the second node N2, the voltage of the second node N2 is pulled up to the first potential V1 higher than the low voltage 0 and lower than the high voltage 1. Therefore, the eighth transistor T8 is turned on, the voltage of the sixth node N6 is the high potential 1 of CB, and the ninth transistor T9 is turned off. In response to the ninth transistor T9 and the tenth transistor T10 being turned off, the fourth node N4 is in a floating state and maintains at the valid potential (low potential) of the previous phase (P2), so that the eleventh transistor T11 is kept on. Therefore, in response to the eleventh transistor T11 being kept on and the twelfth transistor T12 being turned off, the output terminal OUT still outputs a high level voltage.

In the phase P3, like in the phase P1, IN=1, CK changes from 1 to 0, and CB=1. Since CK=0 and IN=1, the first transistor T1 is turned on and transmits the high level voltage from the input terminal IN to the first node N1, so that the first node N1 is set at an invalid potential (high potential); the third transistor T3 is turned on and transmits the low level of the first reference voltage terminal VGL to the second node N2, so that the second node N2 is set a valid potential (low potential). Since CB=1, the seventh transistor T7 and the ninth transistor T9 are turned off. Accordingly, since N1 is at an invalid potential, the second transistor T2 and the tenth transistor T10 are turned off. Since N2 is at the valid potential, the sixth transistor T6 and the eighth transistor T8 are turned on.

Furthermore, since the first reference voltage terminal VGL is applied with a low level voltage, the fourth transistor T4 is turned on to transmit the high level voltage at point N1 to the third node N3. In this way, the third node N3 has the same potential as the first node N1 and is at an invalid potential (high potential), so that the twelfth transistor T12 is turned off. Since the ninth transistor T9 and the tenth transistor T10 are turned off, the fourth node N4 is floating and maintains the potential of the previous phase (time interval t2), that is, the valid potential (low potential), so that the eleventh transistor T11 is kept on. Therefore, in response to the eleventh transistor T11 being turned on and the twelfth transistor T12 being turned off, the output terminal OUT still outputs the high level voltage transmitted by the second reference voltage terminal VGH.

At time interval t3, IN=1, CK changes from 0 to 1, and CB=1. At this time, in response to CK=1, that is, the first clock signal is invalid, the first transistor T1 and the third transistor T3 are turned off; in response to CB=1, that is, the second clock signal remains invalid, the seventh transistor T7 and the ninth transistor T9 are kept off.

Accordingly, in response to the first transistor T1 being turned off, the first node N1 maintains the high potential (invalid potential) of the previous phase (P3), so that the second transistor T2 and the tenth transistor T10 are kept off; in response to the third transistor T3 and the second transistor T2 being turned off, and the second node N2 maintains the valid potential (low potential) of the previous phase (P3), so that the eighth transistor T8 is turned on; and in response to the ninth transistor T9 being turned off, the fourth node N4 remains in the floating state, the low potential (valid potential) of the previous phase (P3) is maintained, so that the eleventh transistor T11 is kept on. Since the second clock signal terminal CB maintains at a high level 1, N1 and N3 also maintain a high level state. The twelfth transistor T12 is still kept off. Therefore, the output terminal OUT still outputs the high level voltage transmitted by the second reference voltage terminal VGH.

In the phase P4, IN changes from 1 to 0, CK=1, and CB changes from 1 to 0. In response to CK=1, that is, the first clock signal is invalid, the first transistor T1 and the third transistor T3 are kept off; in response to CB=0, the second clock signal is valid (at a low level), and the seventh transistor T7 and the ninth transistor T9 are turned on.

Correspondingly, in response to the first transistor T1 being turned off, the first node N1 maintains the high potential (invalid potential) of the previous phase (t3), so that the second transistor T2 and the tenth transistor T10 are kept off; in response to the third transistor T3 and the second transistor T2 being turned off, and the second node N2 maintains the valid potential (low potential) of the previous phase, so the sixth transistor T6 and the eighth transistor T8 are kept on.

Similar to the description in the phase P2, in the phase P4, due to the coupling effect of the capacitor C2 connected between the second clock signal terminal CB and the second node N2, the voltage of the second node N2 is pulled down to the second potential V2 lower than the low voltage 0, the sixth transistor T6 is turned on. In response to the sixth transistor T6 and the seventh transistor T7 being turned on at the same time, the second reference voltage terminal VGH is connected to N1, and the first node N1 is applied with a high level voltage in response to the second reference voltage terminal VGH. In addition, the first node N1 is connected to the third node N3 through the fourth transistor T4, so the second reference voltage terminal VGH will charge the first node N1 and the third node N3, so that these two nodes are always at a high potential (because the second reference voltage terminal VGH is applied with a high level voltage).

As mentioned above, the function of the sixth transistor T6 and the seventh transistor T7 is that, when the first node N1 and the third node N3 are at an invalid potential (a high potential), but may be pulled down by the first capacitor C1 and the third capacitor C3 respectively due to the second clock signal of the second clock signal terminal CB being low, the first node N1 and the third node N3 may be charged to keep the potentials thereof stable, that is, always at a high potential, so as not to affect the off state of the second transistor T2, the tenth transistor T10, and the twelfth transistor T12, thereby avoiding affecting the normal output of the output terminal OUT.

Thus, in response to the third node N3 being at the invalid potential, that is, the high potential, the twelfth transistor T12 is kept off; at the same time, in response to the eighth transistor T8 and the ninth transistor T9 being turned on at the same time, the low level voltage of the second clock signal terminal CB is transmitted to the fourth node N4, and then the fourth node N4 is set at a valid potential (a low potential), so that the eleventh transistor T11 is turned on. Accordingly, in response to the eleventh transistor T11 being turned on and the twelfth transistor T12 being turned off, the high level voltage of the second reference voltage terminal VGH is transmitted to the output terminal OUT, and the output terminal OUT outputs a high level voltage.

At time interval t4, IN=0, CK=1, and CB changes from 0 to 1. At this time, in response to CK=1, that is, the first clock signal is invalid, the first transistor T1 and the third transistor T3 are still kept off; in response to CB=1, the second clock signal becomes invalid (a high level), the seventh transistor T7 and the ninth transistor T9 are turned off.

Since CB changes from 0 to 1, that is, the second clock signal terminal CB changes from a low level state to a high level state, due to the coupling effect of the capacitor C1 connected between the second clock signal terminal CB and the first node N1, the voltage of the first node N1 is pulled up to the third potential V3 higher than the high voltage 1. Due to the coupling effect of the capacitor C3 connected between the second clock signal terminal CB and the third node N3, the voltage of the third node N3 is pulled up to the third potential V3 higher than the high voltage 1. At the same time, since the fourth transistor T4 is turned on, the potentials of the first node N1 and the third node N3 are the same, and both are at an invalid potential (high potential). Therefore, the second transistor T2, the tenth transistor T10, and the twelfth transistor are still kept off.

Due to the coupling effect of the capacitor C2 connected between the second clock signal terminal CB and the second node N2, the voltage of the second node N2 is pulled up to the first potential V1 higher than the low voltage 0 and lower than the high voltage 1. Therefore, the eighth transistor T8 is turned on, the voltage of the sixth node N6 is the high potential 1 of CB, and the ninth transistor T9 is turned off. In response to the ninth transistor T9 and the tenth transistor T10 being turned off, the fourth node N4 is in a floating state and maintains the valid potential (low potential) of the previous phase (P2), so that the eleventh transistor T11 is kept on. Therefore, in response to the eleventh transistor T11 being kept on and the twelfth transistor T12 being turned off, the output terminal OUT still outputs a high level voltage.

In response to the ninth transistor T9 and the tenth transistor T10 being turned off, the fourth node N4 is in a floating state, the valid potential (low potential) of the previous phase (P5) is maintained, so that the eleventh transistor T11 is still kept on. The third nodes N3 and the first potential N1 are both at an invalid potential (high potential) of the same potential, so the twelfth transistor T12 is still kept off. Therefore, in response to the eleventh transistor T11 being kept on and the twelfth transistor T12 being kept off, the output terminal OUT still outputs the high level voltage transmitted by the second reference voltage terminal VGH.

In the phase P5, IN=0, CB=1, CK changes from 1 to 0. In response to CK=0 and IN=0, the first transistor T1 is turned on and transmits the low level voltage from the input terminal IN to the first node N1, so that the first node N1 is set at a valid potential (low potential). The third transistor T3 is turned on and transmits the low level of the first reference voltage terminal VGL to the second node N2, so that the second node N2 is set at a valid potential (low potential). In response to CB=1, the seventh transistor T7 and the ninth transistor T9 are kept off.

In response to the first node N1 being at the valid potential, the second transistor T2 is turned on and the tenth transistor T10 is turned on and the high level voltage of the second reference voltage terminal VGH is transmitted to the fourth node N4, so that the fourth node N4 is set at an invalid potential (high potential), so that the eleventh transistor T11 is turned off. In response to the valid low voltage of the first reference voltage terminal VGL, the fourth transistor T4 is turned on and transmits the low voltage at point N1 to the third node N3, so that N3 is at a low potential, and the twelfth transistor T12 is turned on. Therefore, in response to the eleventh transistor T11 being turned off and the twelfth transistor T12 being turned on, the output terminal OUT outputs the low level voltage transmitted by the first reference voltage terminal VGL.

In the phase after P5, as shown in FIG. 3, the input terminal IN continues to maintain at a low voltage, the first node N1 remains at a low level, and the second transistor T2 is always kept on. Therefore, the voltage of the second node N2 depends on the output level of the first clock signal terminal CK, that is, when the first clock signal terminal CK outputs a high level signal, the potential of the second node N2 is a high level. As shown in FIG. 3, the waveforms of the first clock signal received by the first clock signal terminal CK and the second clock signal received by the second clock signal terminal CB are substantially opposite, that is, when the first clock signal terminal CK outputs the low level signal, the second clock signal terminal CB outputs the high level signal; and when the second clock signal terminal CB outputs the low level signal, the first clock signal terminal CK outputs the high level signal. In this way, when the second clock signal terminal CB outputs a low level, the first clock signal terminal CK outputs a high level, that is, the second node N2 is at a high potential, so the sixth transistor T6 and the seventh transistor T7 cannot be turned on at the same time. In this way, it is ensured that N1 and N3 will not be charged by the high voltage of the second reference voltage terminal VGH.

According to the above description, the function of the second transistor T2 is to control the on and off of the second transistor T6 to ensure that the first node N1 and the third node N3 maintain at a low potential in the phase after P5, so as not to be affected by the high voltage transmitted by the second reference voltage terminal VGH.

In addition, in the phase after P5, according to the above analysis, the input pulse of the input terminal IN remains valid, that is, the low level, the first node N1 and the third node N3 are at the valid potential, that is, the low potential, to ensure that the twelfth transistor T12 to be turned on, and the output terminal OUT outputs a low level voltage. Therefore, when the second clock signal outputted by the second clock signal terminal CB changes from a high level to a low level signal (that is, when it is valid), due to the coupling effect of the capacitor (similar to the bootstrap effect), the third capacitor C3 will further pull down the potential of the third node N3, so that the twelfth transistor T12 is turned on more fully and the output capability is enhanced.

Since the first capacitor C1 exists in the compensation circuit 150, when the second clock signal outputted by the second clock signal terminal CB changes from a high level to a low level signal (that is, it is valid), the first capacitor C1 will synchronously (with the three capacitors C3 pulling down the potential at N3) pull down the potential at the first node N1. At this time, since N1 and N3 are pulled down synchronously and have the same potential, it completely avoids the leakage current flowing through T4, that is, T4 is completely cut off (equivalent to completely disconnected), that is, the first node N1 will not charge the third node N3. The stability of the potential of the third node N3 is ensured, thereby ensuring the stability of the output waveform of the shift register circuit and improving the driving quality of the circuit.

Figure 4:
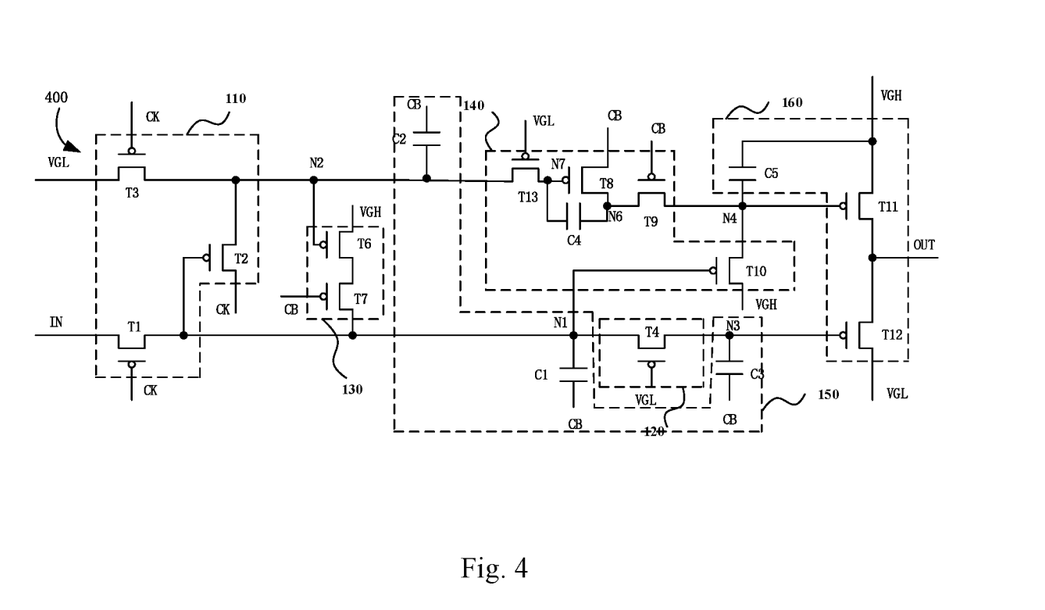
FIG. 4 shows a circuit diagram of a shift register circuit shown in FIG. 1 according to some embodiments of the present disclosure.

FIG. 4 schematically shows the circuit structure of a second example circuit 400 of the shift register circuit 100 shown in FIG. 1. As shown in FIG. 4, the structure of the second example circuit 400 of the shift register circuit 100 is basically the same as the structure of the first example circuit 200 shown in FIG. 2, except that in the second example circuit 400 shown in FIG. 4, the third control circuit 140 further includes a thirteenth transistor T13 and a fourth capacitor C4. The fourth capacitor C4 is connected between a sixth node N6 and a seventh node N7, and a gate electrode of the thirteenth transistor T13 is connected to the first reference voltage terminal VGL, the first electrode of which is connected to the second node N2, and the second electrode of which is connected to the seventh node N7.

In some embodiments of the present disclosure, similar to the functions of the first capacitor C1 and the second capacitor C2, the presence of the fourth capacitor C4 may be advantageous because when the potential at the seventh node N7 is low and the second clock signal of the clock signal terminal CB becomes valid (that is, from high level to low level) (for example, the phase P2 shown in FIG. 3), the eighth transistor T8 and the ninth transistor T9 are turned on. The potential of the seventh node N7 can be further pulled down by the fourth capacitor C4, so as to enhance the driving ability of the eighth transistor T8 and make it turn on more fully. In addition, the purpose of adding a transistor T13 between N2 and N7 is to disconnect or isolate the seventh node N7 from the second node N2 when necessary (for example, when the potential of the seventh node N7 is pulled down by the fourth capacitor C4 to be lower than the potential of N2), so as to prevent the decrease in the potential of the seventh node N7 from affecting the second node N2, maintain the potential of N2 and avoid the jump change, thereby ensuring the stability of the second transistor T2.

Specifically, in the phase P2 shown in FIG. 3, the second clock signal outputted by the second clock signal terminal CB changes from a high level to a low level, the second node N2 is at a low potential, and the thirteenth transistor T13 is turned on in respond to the low level at the first reference voltage terminal VGL, so the seventh node N7 is also at a low potential, the eighth transistor T8 and the ninth transistor T9 are turned on, so the potential of the seventh node N7 is further pulled down by the fourth capacitor C4, to enhance the driving ability of the eighth transistor T8. At this time, due to the decrease of the potential of the seventh node N7 to be lower than the potential of N2, the thirteenth transistor T13 is turned off to a certain extent to reduce the leak current from the second node N2 to the seventh node N7, so that the second node N2 may maintain a relatively stable potential and a jump change is avoided, and the stability of the second transistor T2 is ensured.

Figure 5:
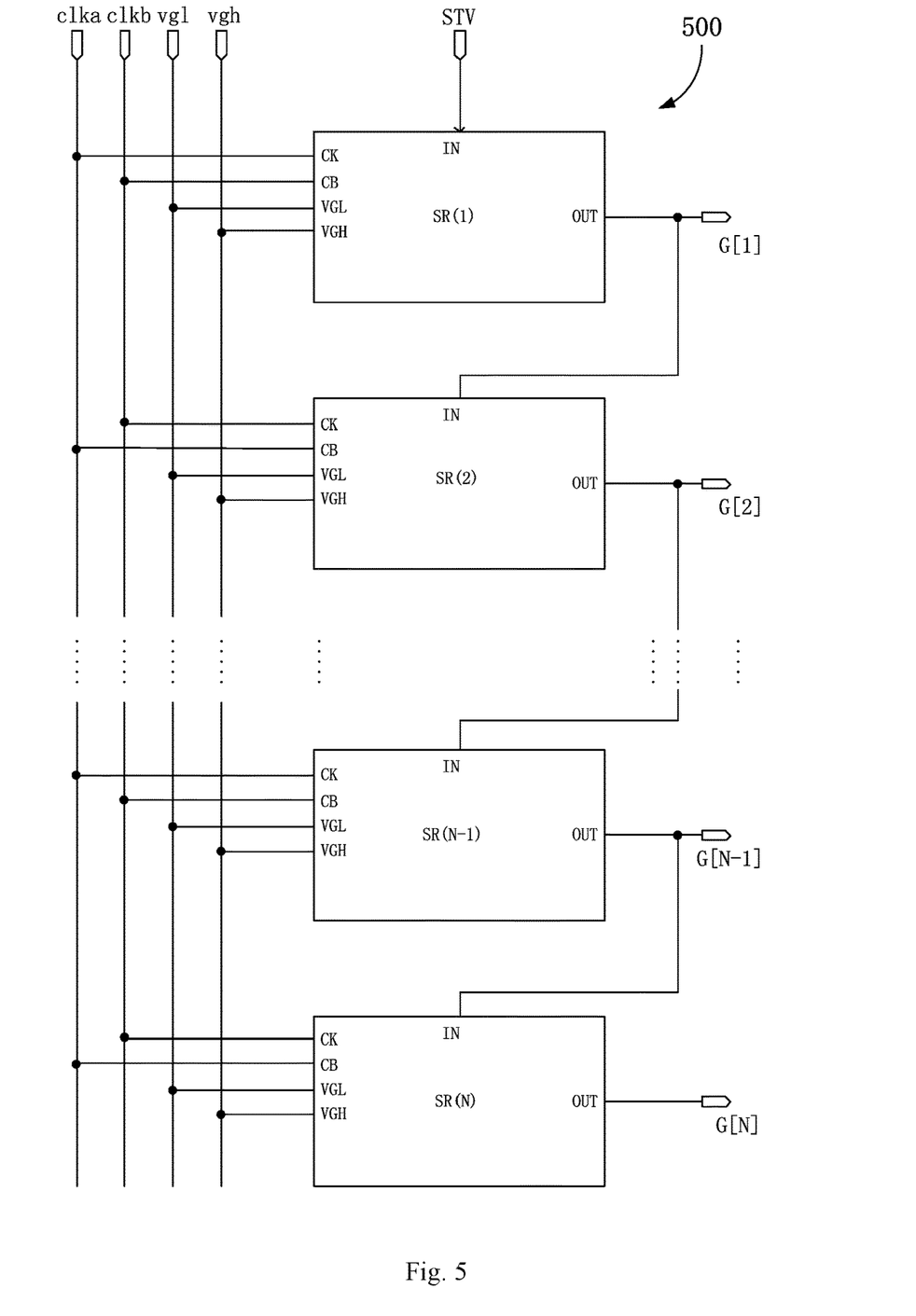
FIG. 5 shows a block diagram of a gate driving circuit of the shift register circuit of FIG. 2.

FIG. 5 schematically shows a block diagram of a gate driving circuit 500 based on the shift register circuit of FIG. 2. As shown in FIG. 5, the gate driver 500 includes N stages of shift register circuits SR(1), SR(2), . . . , SR(N−1) and SR(N) connected in series, each stage of shift register circuit may take the form of a shift register circuit 200 as described in FIG. 2. N can be an integer greater than or equal to 2. In the gate driver 500, except for the Nth stage of shift register circuit SR(N), the output terminal OUT of each stage of shift register circuit is connected to the input terminal IN of a next adjacent stage of shift register circuit.

The N stages of shift register circuits SR(1), SR(2), . . . , SR(N−1) and SR(N) in the gate driver 500 can be respectively connected to N gate lines G[1], G[2], . . . , G[N−1] and G[N]. Each stage of the shift register circuit may also be connected to a first reference voltage line vgl configured to transmit a first reference voltage, a second reference voltage line vgh configured to transmit a second reference voltage, and the first clock line clka and the second clock line clkb configured to transmit a first clock signal and the second clock signal. In particular, the first clock signal terminal CK of the (2k−1)th stage of shift register circuit and the second clock signal terminals CB of the 2kth stage of shift register circuit in the shift register circuits SR(1), SR(2), . . . , SR(N−1) and SR(N) are connected to the first clock line clka, the second clock signal terminal CB of the (2k−1)th stage of shift register circuit and the first clock signal terminals CK of the 2kth stage of shift register circuit in the shift register circuits SR(1), SR(2), . . . , SR(N−1) and SR(N) are connected to the second clock line clkb, where k is a positive integer and 2k≤N. It will be understood that the first and second clock signals CK and CB are supplied to the shift register circuits SR(1), SR(2), . . . , SR(N−1) and SR(N) in this way, so that each stage of the shift register circuit operate with the same (but "time-shifted") timing in order to sequentially generate output signals as pulses for turning on the gate electrode.

The display panel according to some embodiment of the present disclosure includes: a first reference voltage line configured to transmit a first reference voltage; a second reference voltage line configured to transmit a second reference voltage; a first clock line and a second clock line configured to transmit a first clock signal and a second clock signal, the first clock signal and the second clock signal being opposite in phase; and the above-mentioned gate drive circuit.

Each first reference voltage terminal of each of the N stages of shift register circuits is connected to the first reference voltage line.

Each second reference voltage terminal of each of the N stages shift register circuits is connected to the second reference voltage line.

A first clock signal end of the (2k−1)th stage of shift register circuit and a second clock signal end of the 2kth stage of shift register circuit in the N stages of shift register circuits are connected to the first clock line, and a second clock signal end of the (2k−1)th stage of shift register circuit and a first clock signal end of the 2kth stage of shift register circuit in the N stages of shift register circuits are connected to the second clock line, k is a positive integer and 2k≤N.

The display device according to some embodiments of the present disclosure includes: the above-mentioned display panel; a timing controller configured to control the operation of the display panel, wherein the timing controller is configured to supply a first clock signal and a second clock signal to a first clock line and a second clock line, respectively, the first clock signal and the second clock signal are opposite in phase; and a voltage generator configured to supply a first reference voltage and a second reference voltage to a first reference voltage line and a second reference voltage line, respectively, under the control of the timing controller.

Figure 6:
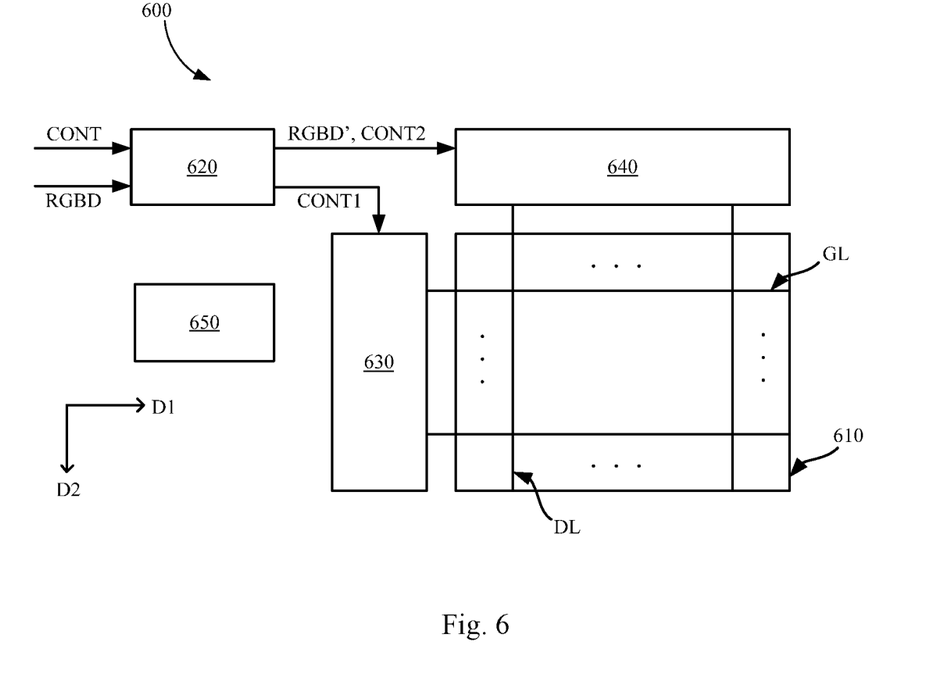
FIG. 6 shows a schematic block diagram of a display device according to some embodiments of the present disclosure.

FIG. 6 schematically shows a block diagram of a display device 600 according to some embodiments of the present disclosure. Referring to FIG. 6, the display device 600 includes a display panel 610, a timing controller 620, a gate driver 630, a data driver 640, and a voltage generator 650. The gate driver 630 may take the form of the gate driving circuit 500 shown in FIG. 5, and the first clock line clka, the second clock line clkb, the first reference voltage line vgl, and the second reference voltage line vgh shown in FIG. 5 are omitted in FIG. 6 for convenience of illustration.

The display panel 610 is connected to a plurality of gate lines GL extending in a first direction D1 and a plurality of data lines DL extending in a second direction D2 crossing (substantially perpendicular to) the first direction D1. The display panel 610 includes a plurality of pixels arranged in a matrix form. Each of the pixels may be electrically connected to a corresponding one of the gate lines GL and a corresponding one of the data lines DL. The display panel 610 may be a liquid crystal display panel, an organic light emitting diode (OLED) display panel, or any other suitable type of display panel.

The timing controller 620 controls the operation of the display panel 610, the gate driver 630, the data driver 640, and the voltage generator 650. The timing controller 620 receives input image data RGBD and an input control signal CONT from an external device (for example, a host). The input image data RGBD may include a plurality of input pixel data for a plurality of pixels. Each input pixel data may include red gray data R, green gray data G, and blue gray data B for a corresponding one of a plurality of pixels. The input control signal CONT may include a main clock signal, a data enable signal, a vertical synchronization signal, a horizontal synchronization signal, and so on. The timing controller 620 generates output image data RGBD', a first control signal CONT1, and a second control signal CONT2 based on the input image data RGBD and the input control signal CONT. The implementation of the timing controller 620 is known in the art. The timing controller 620 can be implemented in many ways (such as using dedicated hardware) to perform various functions discussed herein. A "processor" is an example of a timing controller 620 that employs one or more microprocessors that can be programmed using software (such as microcode) to perform various functions discussed herein. The timing controller 620 may be implemented with or without a processor, and may also be implemented as a combination of dedicated hardware that performs some functions and a processor that performs other functions. Examples of the timing controller 620 include, but are not limited to, conventional microprocessors, application specific integrated circuits (ASIC), and field programmable gate arrays (FPGA).

The gate driver 630 receives the first control signal CONT1 from the timing controller 620. The first control signal CONT1 may include first and second clock signals that are transmitted via the first and second clock lines clka and clkb shown in FIG. 5 and are opposite in phase. The gate driver 630 generates a plurality of gate driving signals for outputting to the gate line GL based on the first control signal CONT1. The gate driver 630 may sequentially apply a plurality of gate driving signals to the gate lines GL.

The data driver 640 receives the second control signal CONT2 from the timing controller 620 and outputs image data RGBD'. The data driver 640 generates a plurality of data voltages based on the second control signal CONT2 and the output image data RGBD'. The data driver 640 may apply the generated plurality of data voltages to the data lines DL.

The voltage generator 650 supplies power to the display panel 610, the timing controller 620, the gate driver 630, the data driver 640, and potentially other components. Specifically, the voltage generator 650 is configured to supply the first reference voltage and the second reference voltage respectively transmitted via the first reference voltage line vgl and the second reference voltage line vgh shown in FIG. 5 under the control of the timing controller 620. The configuration of the voltage generator 650 may be known in the art.

In some embodiments of the present disclosure, the gate driver 630 and/or the data driver 640 may be provided on the display panel 610, or may be connected to the display panel 610 by means of, for example, a Tape Carrier Package (TCP). For example, the gate driver 630 may be integrated in the display panel 610 as a GOA circuit.

Examples of the display device 800 include, but are not limited to, mobile phones, tablet computers, televisions, monitors, notebook computers, digital photo frames, and navigators.

In some embodiments of the present disclosure, a method of driving the shift register circuit 100 according to some embodiments of the present disclosure as shown in FIG. 1 is also provided, which includes: providing an input signal to an input terminal IN; providing a first clock signal and a second clock signal to a first clock signal terminal CK and a second clock signal terminal CB respectively; providing a first reference voltage to a first reference voltage terminal VGL and providing a second reference voltage to the second reference voltage terminal VGH, wherein the first reference voltage and the second reference voltage are at different potentials; and in response to the input signal, the first clock signal, the second clock signal, the first reference voltage, and the second reference voltage, the shift register circuit 100 performs the following operations: outputting an output signal from an output terminal OUT.

In the aforementioned driving method disclosed in some embodiments of the present disclosure, the voltage of at least one of the first node N1, the second node N2, and the third node N3 is compensated in response to a voltage change of the second clock signal.

By using the above-mentioned driving method of the shift register circuit 100 according to some embodiments of the present disclosure, it is possible to avoid the adverse effect of the leakage current formed by the transistor which is not completely turned off on the potential at the third node N3 in the related art, thereby ensuring the transistor in the output circuit 160 is fully and stably turned on, and ensuring the stability of the output waveform and the quality of the output signal.

Although the specific embodiments in the present disclosure have been shown and described, it is obvious to those skilled in the art that several modifications and improvements can be made in its broader aspects without departing from the present disclosure. Therefore, the appended claims should include such modifications and improvements, and these modifications and improvements shall also fall within the true spirit and the scope of the present disclosure.

The invention claimed is:

1. A shift register circuit, comprising:
an input terminal configured to receive an input signal;
a first reference voltage terminal configured to be applied with a first reference voltage;
a second reference voltage terminal configured to be applied with a second reference voltage;
a first clock signal terminal configured to receive a first clock signal;
a second clock signal terminal configured to receive a second clock signal;
an output terminal configured to output an output signal;
an input circuit, configured to control connection or disconnection between the input terminal and a first node, and connection or disconnection of the first reference voltage terminal and a second node in response to the first clock signal received at the first clock signal terminal; and control connection or disconnection of the first clock signal terminal and the second node in response to a potential of the first node;
a first control circuit, configured to control connection or disconnection between the first node and a third node in response to the first reference voltage;
a second control circuit, configured to control connection or disconnection between the second reference voltage terminal and the first node in response to the potential of the second node and the second clock signal;
a third control circuit, configured to control connection or disconnection between the second reference voltage terminal and a fourth node in response to the potential of the first node, and control connection or disconnection between the second clock signal terminal and the fourth node in response to the potential of the second node and the second clock signal;
a compensation circuit, configured to compensate a voltage of at least one of the first node, the second node, and the third node in response to the second clock signal; and
an output circuit, configured to control connection or disconnection of the first reference voltage terminal and the output terminal in response to the potential of the third node, and to control connection or disconnection between the second reference voltage terminal and the output terminal in response to the potential of the fourth node,
wherein the compensation circuit is configured to simultaneously compensate voltages of the first node, the second node, and the third node in response to the second clock signal.

2. The shift register circuit according to claim 1, wherein the compensation circuit comprises:
a first capacitor connected between the second clock signal terminal and the first node;
a second capacitor connected between the second clock signal terminal and the second node; and
a third capacitor connected between the second clock signal terminal and the third node.

3. The shift register circuit according to claim 1, wherein the input circuit comprises:
a first transistor, having a gate electrode connected to the first clock signal terminal, a first electrode connected to the input terminal, and a second electrode connected to the first node;
a second transistor having a gate electrode connected to the first node, a first electrode connected to the first clock signal terminal, and a second electrode connected to the second node; and
a third transistor having a gate electrode connected to the first clock signal terminal, a first electrode connected to the first reference voltage terminal, and a second electrode connected to the second node.

4. The shift register circuit according to claim 1, wherein the first control circuit comprises:
a fourth transistor having a gate electrode connected to the first reference voltage terminal, a first electrode connected to the first node, and a second electrode connected to the third node.

5. The shift register circuit according to claim 1, wherein the second control circuit comprises:
a sixth transistor and a seventh transistor, wherein a gate electrode of the sixth transistor is connected to the second node, a first electrode of the sixth transistor is connected to the second reference voltage terminal, and a second electrode of the sixth transistor is connected to a first electrode of the seventh transistor, a gate electrode of the seventh transistor is connected to the second clock signal terminal, the first electrode of the seventh transistor is connected to the second electrode of the sixth transistor, and a second electrode of the seventh transistor is connected to the first node.

6. The shift register circuit according to claim 1, wherein the third control circuit comprises:
an eighth transistor having a gate electrode connected to the second node, a first electrode connected to the second clock signal terminal, and a second electrode connected to a sixth node;
a ninth transistor having a gate electrode connected to the second clock signal terminal, a first electrode connected to the sixth node, and a second electrode connected to the fourth node;
a tenth transistor having a gate electrode connected to the first node, a first electrode connected to the second reference voltage terminal, and a second electrode connected to the fourth node.

7. The shift register circuit according to claim 6, wherein the third control circuit further comprises:
a thirteenth transistor having a gate electrode connected to the first reference voltage terminal, a first electrode connected to the second node, and a second electrode connected to a seventh node;
a fourth capacitor connected between the sixth node and the seventh node.

8. The shift register circuit according to claim 1, wherein the output circuit comprises:
an eleventh transistor having a gate electrode connected to the fourth node, a first electrode connected to the second reference voltage terminal, and a second electrode connected to the output terminal; and a twelfth transistor having a gate electrode connected to the third node, a first electrode connected to the first reference voltage terminal, and a second electrode connected to the output terminal.

9. The shift register circuit according to claim 8, wherein the output circuit further comprises a fifth capacitor connected between the fourth node and the second reference voltage terminal.

10. A gate driving circuit, comprising N stages of shift register circuits according to claim 1 connected in series, wherein N is an integer greater than or equal to 2, in the N stages of shift register circuits, an output terminal of an mth stage of shift register circuit is connected to an input terminal of an (m+1)th stage of shift register circuit, wherein m is an integer and 1≤m<N.

11. A display panel, comprising:
the first reference voltage line configured to transmit the first reference voltage;
the second reference voltage line configured to transmit the second reference voltage;
a first clock line and a second clock line, configured to transmit the first clock signal and the second clock signal, wherein the first clock signal and the second clock signal are opposite in phase; and
the gate driving circuit according to claim 10,
wherein each first reference voltage terminal of each of the N stages of shift register circuits is connected to the first reference voltage line,
each second reference voltage terminal of each of the N stages shift register circuits is connected to the second reference voltage line,
a first clock signal end of a (2k−1)th stage of shift register circuits and a second clock signal end of a 2kth stage of shift register circuits in the N stages of shift register circuits are connected to the first clock line, and a second clock signal end of the (2k−1)th stage of shift register circuits and a first clock signal end of the 2kth stage of shift register circuits in the N stages of shift register circuits are connected to the second clock line, where k is a positive integer and 2k≤N.

12. A display device, comprising:
the display panel according to claim 11;
a timing controller configured to control operation of the display panel, wherein the timing controller is configured to supply a first clock signal and a second clock signal to a first clock line and a second clock line, respectively, the first clock signal and the second clock signal are opposite in phase; and
a voltage generator configured to supply a first reference voltage and a second reference voltage to a first reference voltage line and a second reference voltage line, respectively, under the control of the timing controller.

13. A method of driving the shift register circuit according to claim 1, comprising:
providing an input signal to an input terminal;
providing a first clock signal and a second clock signal to a first clock signal terminal and a second clock signal terminal respectively;
providing a first reference voltage to a first reference voltage terminal and providing a second reference voltage to the second reference voltage terminal, wherein the first reference voltage and the second reference voltage are at different potentials; and
in response to the input signal, the first clock signal, the second clock signal, the first reference voltage, and the second reference voltage, the shift register circuit performing the following operations: outputting an output signal from an output terminal.

14. The method according to claim 13, wherein in response to a voltage change of the second clock signal, the voltage of at least one of the first node, the second node, and the third node is compensated.

* * * * *